US008923055B2

(12) United States Patent
Baek et al.

(10) Patent No.: US 8,923,055 B2
(45) Date of Patent: Dec. 30, 2014

(54) SEMICONDUCTOR DEVICE AND METHOD OF OPERATING THE SAME

(75) Inventors: Kwang Ho Baek, Gyeonggi-do (KR); Jin Su Park, Daegu (KR); Chang Won Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 123 days.

(21) Appl. No.: 13/492,286

(22) Filed: Jun. 8, 2012

(65) Prior Publication Data

US 2012/0314506 A1 Dec. 13, 2012

(30) Foreign Application Priority Data

Jun. 9, 2011 (KR) .................... 10-2011-0055530

(51) Int. Cl.
| G11C 11/34 | (2006.01) |
| G11C 7/12 | (2006.01) |
| G11C 11/56 | (2006.01) |
| G11C 16/04 | (2006.01) |
| G11C 16/24 | (2006.01) |

(52) U.S. Cl.
CPC .............. *G11C 7/12* (2013.01); *G11C 11/5628* (2013.01); *G11C 16/0483* (2013.01); *G11C 16/24* (2013.01)
USPC ............ 365/185.12; 365/185.17; 365/185.18; 365/185.21; 365/185.33

(58) Field of Classification Search
USPC ............. 365/185.12, 185.17, 185.18, 185.21, 365/185.33
See application file for complete search history.

(56) References Cited

U.S. PATENT DOCUMENTS

| 6,813,214 | B2 * | 11/2004 | Cho et al. | ................. | 365/185.12 |
| 7,684,239 | B2 * | 3/2010 | Kang | ......................... | 365/185.18 |
| 7,848,147 | B2 * | 12/2010 | Park | ......................... | 365/185.18 |
| 8,081,508 | B2 * | 12/2011 | Kim et al. | ................ | 365/185.17 |
| 8,081,522 | B2 * | 12/2011 | Murakami | ............... | 365/185.12 |
| 8,189,383 | B2 * | 5/2012 | Yang et al. | ................ | 365/185.12 |
| 8,432,737 | B2 * | 4/2013 | Shiga | ........................ | 365/185.17 |
| 8,472,245 | B2 * | 6/2013 | Kim | ......................... | 365/185.17 |
| 8,514,621 | B2 * | 8/2013 | Choi et al. | ............... | 365/185.12 |
| 8,593,867 | B2 * | 11/2013 | Lee et al. | ................. | 365/185.12 |

FOREIGN PATENT DOCUMENTS

KR 100562134 3/2006

OTHER PUBLICATIONS

Notice of Allowance issued by the Korean Intellectual Property Office on May 22, 2013.

* cited by examiner

*Primary Examiner* — Trong Phan
(74) *Attorney, Agent, or Firm* — IP & T Group LLP

(57) ABSTRACT

A semiconductor device includes cell strings that each include a plurality of memory cells, a page buffer having latches coupled to bit lines and precharge the bit lines in response to page buffer control signals, a page buffer control circuit configured to generate the page buffer control signals using a high voltage source, and a controller configured to generate control signals for controlling the page buffer control circuit.

12 Claims, 9 Drawing Sheets

Number of program data '0'

(A)

(B)

(C)

US 8,923,055 B2

SEMICONDUCTOR DEVICE AND METHOD OF OPERATING THE SAME

CROSS-REFERENCE TO RELATED APPLICATION

Priority to Korean patent application number 10-2011-0055530 filed on Jun. 9, 2011, the entire disclosure of which is incorporated by reference herein, is claimed.

BACKGROUND

An embodiment of this disclosure relates to a semiconductor device and a method of operating the same and, more particularly, to the controller of a semiconductor device for controlling page buffers.

A semiconductor device includes a memory cell array for storing data and a plurality of circuits for storing data in the memory cell array or reading data stored in the memory cell array. A page buffer included in the plurality of circuits controls voltages of bit lines, coupled to the memory cell array, in response to page buffer signals generated from the controller.

FIG. 1 is a circuit diagram illustrating a conventional controller and a conventional page buffer.

Referring to FIG. 1, a semiconductor device includes a memory cell array 10, a plurality of page buffers 20, and a controller 40.

The memory cell array 10 includes a plurality of memory blocks. Each of the memory blocks includes a plurality of cell strings each coupled between a bit line BLe or BLo and a common source line CSL. The cell strings are divided into even cell strings STe and odd cell strings STo according to an order of their arrangements. FIG. 1 shows a pair of even and odd cell strings STe and STo included in one of the memory blocks. A bit line coupled to the even cell string STe is called an even bit line BLe, and a bit line coupled to the odd cell string STo is called an odd bit line BLo. The cell strings have the same construction, and thus only the even cell string Ste is described in detail below as an example.

The even cell string STe includes a drain select transistor DST, a plurality of memory cells F0 to Fn, and a source select transistor SST which are coupled in series between the even bit line BLe and the common source line CSL. The gates of the drain select transistors DST included in the cell strings STe and STo are coupled to a drain select line DSL, the gates of the memory cells F0 to Fn included in the cell strings STe and STo are coupled to a plurality of word lines WL0 to WLn, and the gates of the source select transistors SST included in the cell strings STe and STo are coupled to a source select line SSL.

The page buffer 20 includes a bit line selection circuit 30 for selecting one of the bit lines BLe and BLo, a sense circuit 22 for transferring the potential of a selected bit line to a sense node SO in a read operation, a precharge circuit 21 for precharging the sense node SO, a first latch 25 and a second latch 26 for storing data, a first transfer circuit 23 for transferring data, stored in the first latch 25, to the sense node SO, a second transfer circuit 24 for transferring data, stored in the second latch 26, to the sense node SO, a first set/reset circuit 27 for setting up or resetting the first latch 25, a second set/reset circuit 28 for setting up or resetting the second latch 26, and a discharge circuit 29 for discharging a common node CON.

The bit line selection circuit 30 includes a bit line precharge circuit 31 for precharging the even bit line BLe or the odd bit line BLo in a program operation and a selection circuit 32 for selecting the even bit line BLe or the odd bit line BLo.

The bit line precharge circuit 31 includes a first switch N01 for precharging the even bit line BLe in response to an even precharge signal DISE and a second switch N02 for precharging the odd bit line BLO in response to an odd precharge signal DISO. The first switch N01 is formed of an NMOS transistor coupled between the even bit line BLe and a terminal for supplying virtual voltage VIRPWR. The second switch N02 is formed of an NMOS transistor coupled between the odd bit line BLe and the terminal for supplying the virtual voltage VIRPWR.

The selection circuit 32 includes a third switch N03 for selecting the even bit line BLe in response to an even selection signal BSLE and a fourth switch N04 for selecting the odd bit line BLo in response to an odd selection signal BSLO. Each of the third switch N03 and the fourth switch N04 is formed of an NMOS transistor.

The sense circuit 22 includes a fifth switch N05 for coupling a selected bit line and the sense node SO in response to a sense signal PBSENSE. The fifth switch N05 is formed of an NMOS transistor.

The precharge circuit 21 includes a sixth switch N06 for coupling a terminal for a power supply voltage VDD and the sense node SO in response to a precharge signal PRECHb and precharging the sense node SO. The sixth switch N06 is formed of a PMOS transistor.

The first latch 25 includes first and second inverters I1 and I2. The output terminal of the first inverter I1 and the input terminal of the second inverter I2 are coupled to a node QA, and the output terminal of the second inverter I2 and the input terminal of the first inverter I1 are coupled to each other.

The second latch 26 includes third and fourth inverters I3 and I4. The output terminal of the third inverter I3 and the input terminal of the fourth inverter I4 are coupled to a node QB, and the output terminal of the fourth inverter I4 and the input terminal of the third inverter I3 are coupled to each other. Although only the two latches 25 and 26 are illustrated as being included in the page buffer 20 of FIG. 1, one latch or three or more latches may be included in the page buffer 20 according to a semiconductor device.

The first transfer circuit 23 includes an eighth switch N08 for coupling the output terminal of the first inverter I1 and the sense node SO in response to a first transfer signal TRANM. The eighth switch N08 is formed of an NMOS transistor.

The second transfer circuit 24 includes a tenth switch N10 for coupling the output terminal of the third inverter I3 and the sense node SO in response to a second transfer signal TRANC. The tenth switch N10 is formed of an NMOS transistor.

The first set/reset circuit 27 includes an $11^{th}$ switch N11 for resetting the first latch 25 by coupling the output terminal of the second inverter I2 and the common node CON in response to a first reset signal RESET_A and a $12^{th}$ switch N12 for setting up the first latch 25 by coupling the input terminal of the second inverter I2 and the common node CON in response to a first set signal SET_A. Each of the $11^{th}$ and the $12^{th}$ switches N11 and N12 is formed of an NMOS transistor.

The second set/reset circuit 28 includes a $13^{th}$ switch N13 for resetting the first latch 26 by coupling the output terminal of the fourth inverter I4 and the common node CON in response to a second reset signal RESET_B and a $14^{th}$ switch N14 for setting up the first latch 26 by coupling the input terminal of the fourth inverter I4 and the common node CON in response to a second set signal SET_B. Each of the $13^{th}$ and the $14^{th}$ switches N13 and N14 is formed of an NMOS transistor.

The discharge circuit 29 includes a $15^{th}$ switch N15 for discharging the common node CON by coupling the common node CON and a ground terminal Vss in response to voltage of a sense node SO. The 15$^{th}$ switch N15 is formed of an NMOS transistor.

The controller 40 includes a plurality of circuits for controlling circuits included in the semiconductor device. FIG. 1 shows a page buffer control circuit (50 and 60) from among the plurality of circuits. The page buffer control circuit (50 and 60) includes a high voltage generation unit 50 for generating high voltages and a voltage divider unit 60 for converting the high voltages of the high voltage generation unit 50 in the form of page buffer control signals PB SIGNALS having various levels and outputting the page buffer control signals PB SIGNALS. The high voltage generation unit 50 includes first to k$^{th}$ high voltage generators HV1 to HVk for generating the respective high voltages in response to first to k$^{th}$ control signals CON1 to CONk. The voltage divider unit 60 includes first to k$^{th}$ voltage dividers DIV1 to DIVk for outputting the high voltages in the form of the respective page buffer control signals PB SIGNALS having various levels. According to an example, the reason why a plurality of the first to k$^{th}$ high voltage generators HV1 to HVk is used as high voltage sources for the page buffer control signals PB SIGNALS is to make the page buffer control signals PB SIGNALS rapidly reach a target level. For example, the first voltage divider DIV1 may receive the high voltage from the first high voltage generator HV1 and output the even precharge signal DISE for turning on the first switch N01. The second voltage divider DIV2 may receive the high voltage from the second high voltage generator HV2 and output the odd precharge signal DISO. Likewise, the voltage dividers DIV1 to DIVk may receive the respective high voltages from the high voltage generators HV1 to HVk and output the respective page buffer control signals PB SIGNALS for turning on or off the switches included in the page buffer 20.

If the plurality of high voltage generators HV1 to HVk are used as the high voltage sources for the page buffer control signals PB SIGNALS, however, the operating speed of the page buffer 20 may be increased, but the amount of current consumed by the plurality of high voltage generators HV1 to HVk is increased because the plurality of high voltage generators are driven. According to an example, capacitance between the even and odd bit lines (that is, parasitic capacitive coupling between the even and odd bit lines) is greatly increased because the number of program data '0' is larger in the early stage of a program operation than in the latter part of the program operation. For this reason, in raising the potentials of unselected bit lines up to a level equivalent to a program inhibition voltage Vcc, a peak current rises. At this time, the amount of current may suddenly rise.

BRIEF SUMMARY

An exemplary embodiment relates to a semiconductor device and a method of operating the same, which reduce an electric current consumed in a program operation based on the principle that the driving force of a high voltage generator is changed depending on the number of programmed cells within a selected page in the program operation.

A semiconductor device according to an aspect of the present disclosure includes cell strings that each include a plurality of memory cells; a page buffer having latches coupled to bit lines and precharge the bit lines in response to page buffer control signals; a page buffer control circuit configured to generate the page buffer control signals using a high voltage source; and a controller configured to generate control signals for controlling the page buffer control circuit.

A semiconductor device according to another aspect of the present disclosure includes even and odd cell strings that each include a plurality of memory cells; a page buffer including a bit line precharge circuit for precharging an even bit line coupled to the even cell string and an odd bit line coupled to the odd cell string in response to an even precharge signal and an odd precharge signal, respectively, a selection circuit for selecting the even bit line and the odd bit line in response to an even selection signal and an odd selection signal, respectively, a sense circuit for coupling a selected bit line and a sense node in response to a sense signal, and a transfer circuit for transferring data stored in a latch to the sense node in response to a transfer signal; and a page buffer control circuit configured to generate the even and odd precharge signals, the even and odd selection signals, the sense signal, and the transfer signal using a high voltage source.

A semiconductor device according to yet another aspect of the present disclosure includes page buffers configured to store data and a page buffer control circuit configured to generate page buffer control signals for operating the page buffers, wherein the page buffer control circuit includes a high voltage generator configured to generate a high voltage and to have a driving force that varies depending on data stored in the page buffers and voltage dividers configured to commonly receive the high voltage and to generate the page buffer control signals in response to control signals.

A method of operating a semiconductor device according to yet another aspect of the present disclosure includes generating a high voltage using a high voltage source; generating page buffer control signals by dividing the high voltage; and supplying a program inhibition voltage or a program permission voltage to bit lines coupled to cell strings in response to the page buffer control signals.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
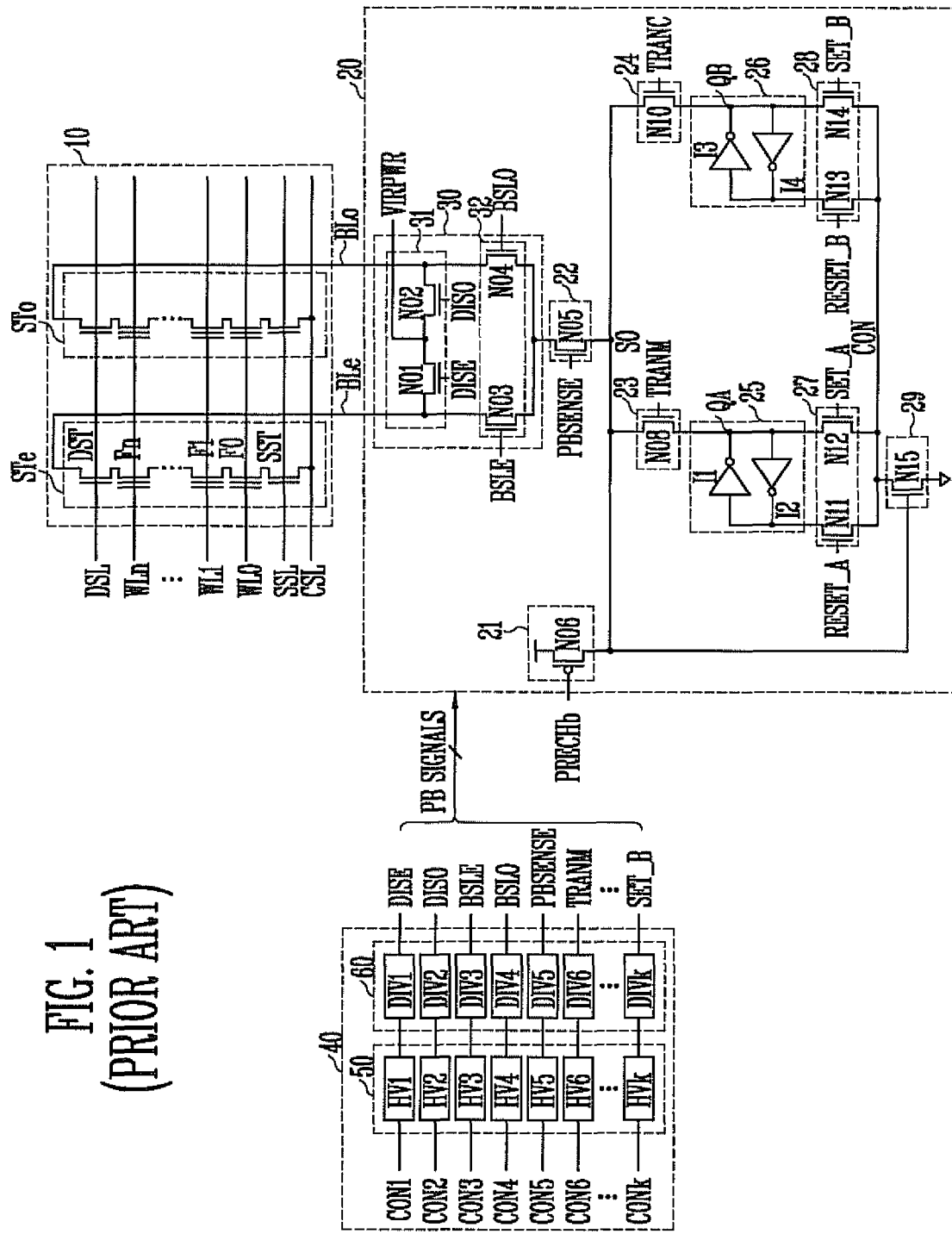
FIG. 1 is a circuit diagram illustrating a conventional controller and a conventional page buffer.
Figure 2:
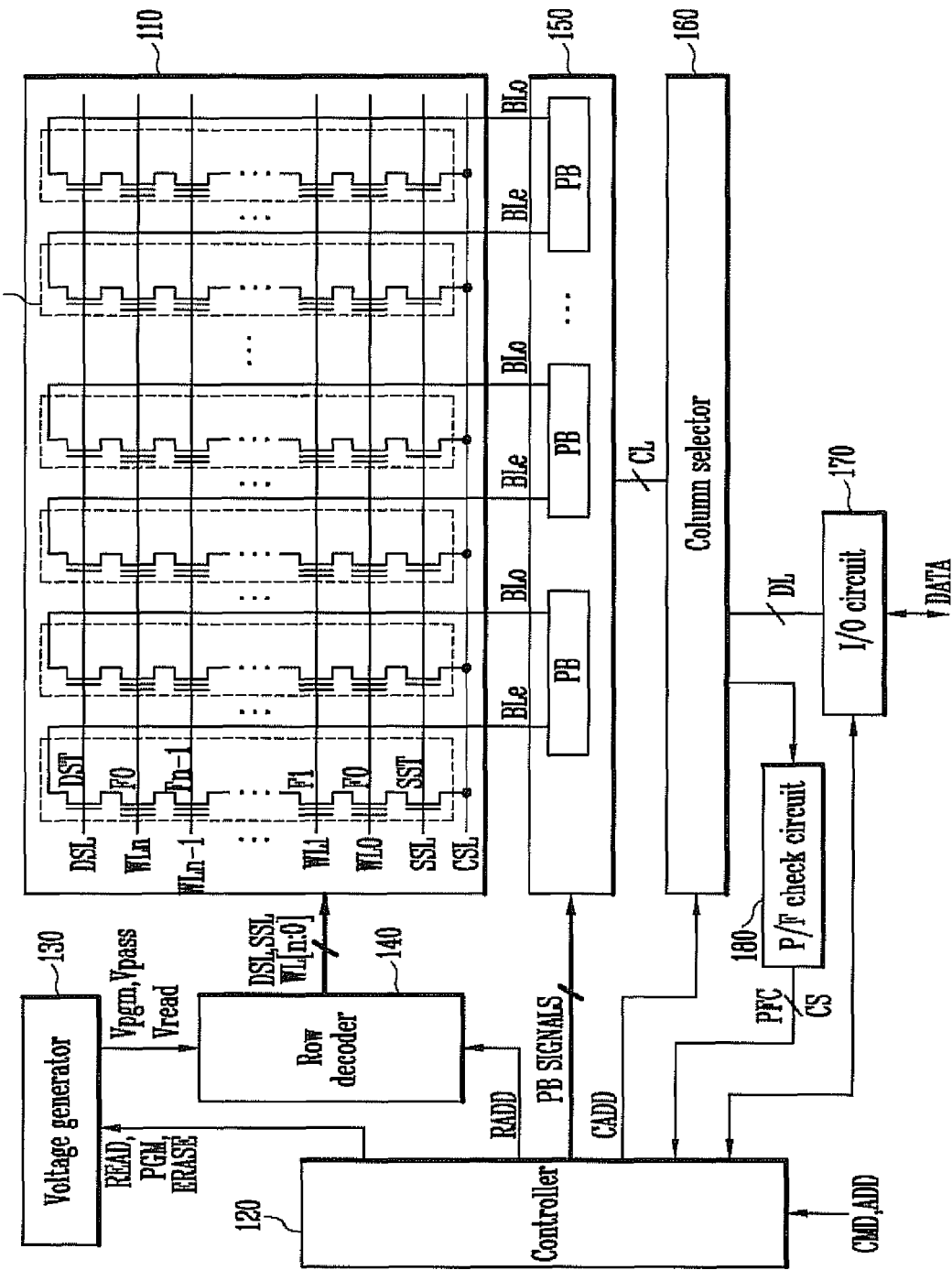
FIG. 2 is a block diagram illustrating a semiconductor device according to the present disclosure.

FIG. 2 is a block diagram illustrating a semiconductor device according to the present disclosure.

Referring to FIG. 2, the semiconductor memory device includes a memory cell array 110, a plurality of circuits (130, 140, 150, 160, 170, and 180) configured to perform a program operation or a read operation on memory cells included in the memory cell array 110, and a controller 120 configured to control the plurality of circuits (130, 140, 150, 160, 170, and 180) in order to set the threshold voltages of selected memory cells based on input data.

In case of a NAND flash memory device, the circuits include a voltage generator 130, a row decoder 140, a page buffer group 150, a column selector 160, an Input/Ouptut (I/O) circuit 170, and a Pass/Fail (P/F) check circuit 180.

The memory cell array 110 includes a plurality of memory blocks. An exemplary one of the memory blocks is shown in FIG. 2. The memory block includes a plurality of strings ST. Some of the strings ST are designated as normal strings, and some of the strings ST are designated as flag strings. The strings ST have the same construction. Each of the strings ST includes a source select transistor SST coupled to a common source line CSL, a plurality of memory cells F0 to Fn, and a drain select transistor DST coupled to a bit line BL. Memory cells included in the flag string are called flag cells, where the flag cells have the same construction as the normal cells included in the normal strings. The gate of the source select transistor SST is coupled to a source select line SSL, the gates of the memory cells F0 to Fn are coupled to respective word lines WL0 to WLn, and the gate of a drain select transistor DST is coupled to a drain select line DSL. The strings ST are coupled between respective bit lines BLe and BLo and the common source line CSL. In the bit lines, even-numbered bit lines are called even bit lines BLe, and odd-numbered bit lines are called odd bit lines BLo depending on their arrangements. Furthermore, the strings coupled to the even bit lines BLe are called even strings, and the string coupled to the odd bit lines BLo are called odd strings.

The controller 120 exercises a control so that an operation of supplying an erase pulse to memory cells is performed, an erase verify operation of detecting whether the threshold voltages of the memory cells have a target erase voltage through the page buffer group 150 is performed, a pre-program operation is performed on cells having threshold voltages of the target erase voltage if, as a result of the erase verify operation, the cells having the threshold voltages of the target erase voltage and cells having threshold voltages higher than the target erase voltage coexist, and the operation of supplying an erase pulse, the erase verify operation, and the pre-program operation are repeatedly performed until the threshold voltages of all the memory cells reach the target erase voltage after the pre-program operation is performed. The controller 120 internally generates a program operation signal PGM, a read operation signal READ, or an erase operation signal ERASE in response to a command signal CMD and also generates page buffer signals PB SIGNALS for controlling the page buffers PB of the page buffer group 150 depending on a type of an operation. According to an example, the controller 120 includes a page buffer control circuit (not shown) for generating the page buffer signals PB SIGNALS. The page buffer control circuit (not shown) includes a single high voltage generator and a plurality of voltage dividers and generates the page buffer signals PB SIGNALS using the plurality of voltage dividers. The page buffer control circuit (not shown) is described in detail with reference to FIGS. 5A to 5C.

The controller 120 internally generates a row address signal RADD and a column address signal CADD in response to an address signal ADD. Furthermore, the controller 120 checks whether the threshold voltages of selected memory cells have risen or lowered to a target voltage in response to a check signal PFC generated from the P/F check circuit 180 in a program or erase verify operation. The controller 120 determines whether or not to perform a program or erase operation again or whether a result of the program or erase operation is a pass or fail according to a result of the check.

The voltage supply circuit (130 and 140) supplies voltages for the program operation, the erase operation, or the read operation of memory cells to the drain select line DSL, the word lines WL0 to WLn, and the source select line SSL of a selected memory block in response to the signals PGM, ERASE, READ, and RADD of the controller 120. The voltage supply circuit (130 and 140) includes the voltage generator 130 and the row decoder 140.

The voltage generator 130 outputs operating voltages for programming, reading, or erasing memory cells to global lines in response to the internal operating signals PGM, READ, and ERASE (that is, internal command signals) of the controller 120. If memory cells are sought to be programmed, the voltage generator 130 outputs operating voltages (for example, Vpgm, Vpass, and Vread) for program to the global lines.

The row decoder 140 transfers the operating voltages of the voltage generator 130 to the lines DSL, SSL, and WL[n:0] of a selected memory block in response to the row address signals RADD of the controller 120.

The page buffer group 150 detects the program state or the erase state of memory cells. The page buffer group 150 includes the page buffers PB that are each coupled to the bit lines BLe and BLo. The page buffer group 150 supplies each of the bit lines BLe and BLo with voltage for storing data in the memory cells F0 to Fn in response to the page buffer signals PB SIGNALS of the controller 120. More particularly, the page buffer group 150 precharges the bit lines BLe and BLo or latches data, corresponding to the threshold voltages of the memory cells F0 to Fn, detected based on shifts in the voltages of the bit lines BLe and BLo, in the program operation, the erase operation, or the read operation of the memory cells F0 to Fn. That is, in the program operation, the page buffers PB of the page buffer group 150 supply a program permission voltage 0 V to the respective bit lines BLe or BLo when program data inputted to their latches is '0' and supply a program inhibition voltage Vcc to the respective bit lines BLe or BLo when the program data is '1'. Furthermore, in the read operation, the page buffers PB detect data stored in the memory cells F0 to Fn by controlling the voltages of the bit lines BLe or BLo based on data stored in the memory cells F0 to Fn. Furthermore, the page buffers PB supply an erase allow voltage (for example, Vcc) to the bit lines BLe or BLo at the early stage of an erase operation and supply a program permission voltage (for example, 0 V) to bit lines coupled to erased strings ST in a program operation performed as a result of an erase verify operation during an erase operation. The program permission voltage is determined based on data inputted to the latch of each of the page buffers PB according to a result of the erase verify operation.

The column selector 160 selects the page buffers PB of the page buffer group 150 in response to the column address signal CADD of the controller 120. Data latched in a page buffer selected by the column selector 160 is outputted. Furthermore, the column selector 160 receives data from the page buffer group 150 through a column line CL and transfers the data to the P/F check circuit 180.

The I/O circuit 170 transfers external data DATA to the column selector 160 through data lines DL under the control of the controller 120 in a program operation so that the external data DATA is inputted to the page buffers PB of the page buffer group 150. When the column selector 160 sequentially transfers the external data DATA to the page buffers PB of the page buffer group 150, the page buffers PB store the external data DATA in their latches. Furthermore, in a read operation, the I/O circuit 170 externally outputs data DATA received from the page buffers PB of the page buffer group 150 through the column selector 160.

The P/F check circuit 180 checks whether program-fail cells have occurred or not in a verify operation performed after a program or erase operation and outputs a result of the check in the form of a check signal PFC. Furthermore, the P/F check circuit 180 also functions to count the number of program-fail cells and output a result of the count in the form of the count signal CS.

The controller 120 controls the level of a program voltage supplied to a selected word line in the program operation of memory cells coupled to the selected word line and controls the voltage generator 130 so that verify voltages are selectively supplied to a selected word line in a program verify operation. In this case, the controller 120 may control the voltage generator 130 in response to the check signal PFC of the P/F check circuit 180.

Figure 3:
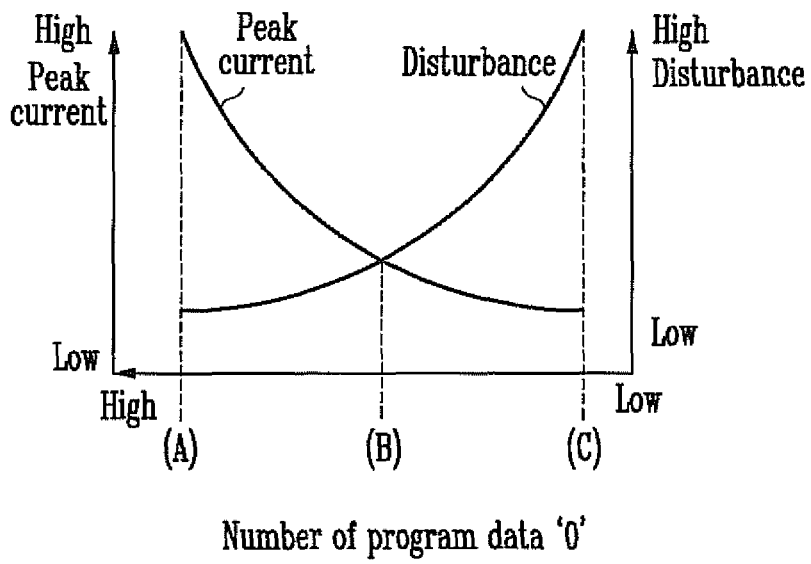
FIG. 3 is a graph illustrating a peak current and disturbance according to program data in a program operation.

FIG. 3 is a graph illustrating a peak current and disturbance according to program data in a program operation.

The program operation of the semiconductor device is described in short below with reference to FIG. 3. The program operation includes performing an operation of raising the threshold voltages of selected memory cells, performing a verify operation of verifying whether the threshold voltages of the memory cells have reached a target level, and repeating the above operations until all the threshold voltages reach the target level while gradually raising a program voltage, if a result of the verify operation is not a pass. According to an example, in the verify operation, whether the threshold voltages of all memory cells to be programmed, from among memory cells included in a selected page (that is, a group of memory cells coupled to the same word line), have reached the target level is verified. A program permission voltage 0 V is supplied to bit lines coupled to memory cells having threshold voltages not reached the target level as a result of the verify operation, and a program inhibition voltage Vcc is supplied to bit lines coupled to memory cells having threshold voltages reached the target level as a result of the verify operation. Here, program data stored in the latches of page buffers, coupled to the memory cells having the threshold voltages reached the target level, is changed from '0' to '1' in the verify operation, and thus the program inhibition voltage Vcc is supplied to the bit lines coupled to the memory cells having the threshold voltages reached the target level in a subsequent program operation.

As a result of the verify operation, the number of program data '0' stored in the latches of the page buffers is the greatest at the early stage (A) of the program operation, the number of program data '0' stored in the latches of the page buffers in the middle stage (B) of the program operation is more reduced than that at the early stage (A) (instead, the number of program data '1' is increased), and all the program data '0' stored in the latches of the page buffers is changed into '1' when the program operation is completed (C). According to an example, at the early stage (A) of the program operation in which the number of program data '0' is the greatest, a peak current is the highest because the number of bits lines to which the program permission voltage 0 V is supplied is the largest. In contrast, disturbance corresponding to the program inhibition potential is reduced according to an increase in the number of program data '0'. That is, the peak current of the bit lines is inversely proportional to disturbance energy. A change of the peak current according to the program data is described in detail below.

Figure 4A:
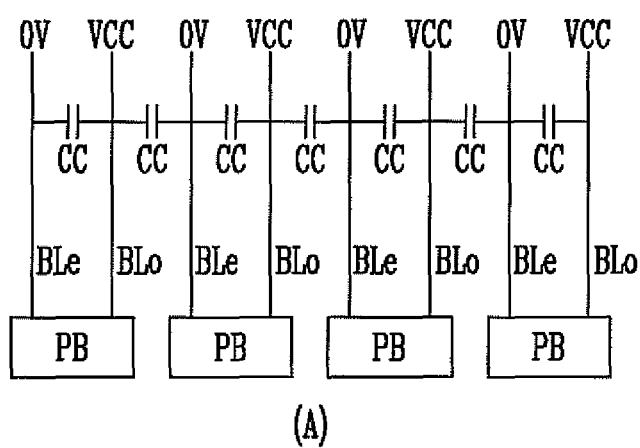
FIG. 4A is a diagram illustrating a section (A) of FIG. 3.

FIG. 4A is a diagram illustrating the section (A) of FIG. 3.

The section (A) of FIG. 3 corresponds to the early stage of the program operation in which the number of program data '0' is the greatest. In FIG. 4A, it is assumed that even bit lines BLe are selected and odd bit lines BLo are not selected. The program inhibition voltage Vcc is supplied to all the unselected odd bit lines BLo, and the program permission voltage 0 V is supplied to bit lines BLe selected from the selected even bit lines BLe. In FIG. 4A, all the even bit lines BLe are assumed to be selected bit lines, for illustration purposes, but the program inhibition voltage Vcc is supplied to bit lines BLo on which the program operation will not be performed, from among the selected even bit lines BLe, based on program data inputted to the page buffer PB. If the bit line BLo to which the program inhibition voltage Vcc is supplied and the bit line BLe to which the program permission voltage 0 V is supplied are adjacent to each other as shown in FIG. 4A, capacitance cc is generated due to a potential difference between the two bit lines BLe and BLo. It becomes difficult to raise the potential to the program inhibition voltage (Vcc) level as the capacitance cc is increased. As a result, the peak current is increased as in the section (A) of FIG. 3.

Figure 4B:
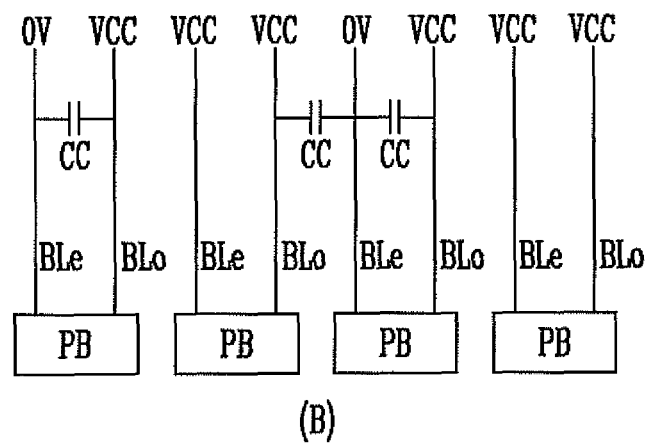
FIG. 4B is a diagram illustrating a section (B) of FIG. 3.

FIG. 4B is a diagram illustrating the section (B) of FIG. 3.

The section (B) of FIG. 3 corresponds to the middle stage of the program operation. In this section, some of program data stored in the latches of the page buffers PB is changed from '0' to '1' as the number of programmed memory cells is gradually increased. When the program data is changed from '0' to '1', the program inhibition voltage Vcc is supplied to the even bit lines BLe coupled to the relevant page buffers PB. That is, since the number of bit lines BLe to which the program permission voltage 0 V is supplied is decreased, the capacitance cc between the bit lines BLe and BLo (that is, a capacitance corresponding to capacitive-coupling) is also decreased, and it becomes easy to supply the program inhibition voltage Vcc to the bit lines BLe and BLo due to a decrease of the capacitance cc. As a result, the peak current in the middle stage (B) of the program operation is reduced that at the early stage (A) of the program operation.

Figure 4C:
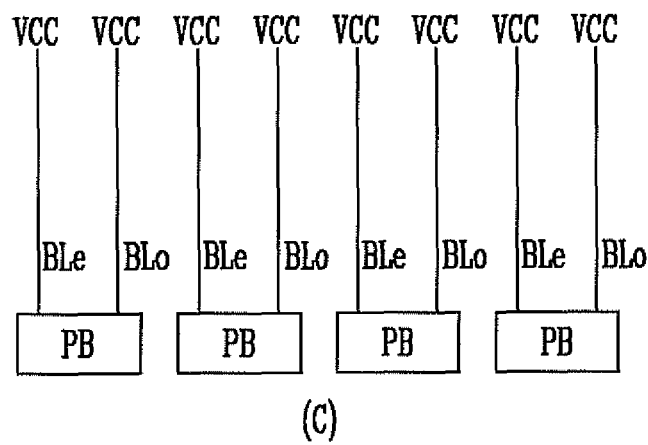
FIG. 4C is a diagram illustrating a section (C) of FIG. 3.

FIG. 4C is a diagram illustrating the section (C) of FIG. 3.

The section (C) of FIG. 3 corresponds to the completion stage of the program operation. In this section, the entire program data stored in the latches of the page buffers PB becomes '1'. Accordingly, when the program inhibition voltage Vcc is supplied to all the even and odd bit lines BLe and BLo, the capacitance cc between the bit lines BLe and BLo is a minimum, and thus the peak current is also a minimum.

In the program operation described with reference to FIG. 3 and FIGS. 4A to 4C, it can be seen that the number of program data '0' is the greatest at the early stage (A) of the program operation and the capacitance cc is the greatest at this time. A method of reducing the peak current of the bit lines BLe and BLo in a program operation based on this principle is described below.

Figure 5A:
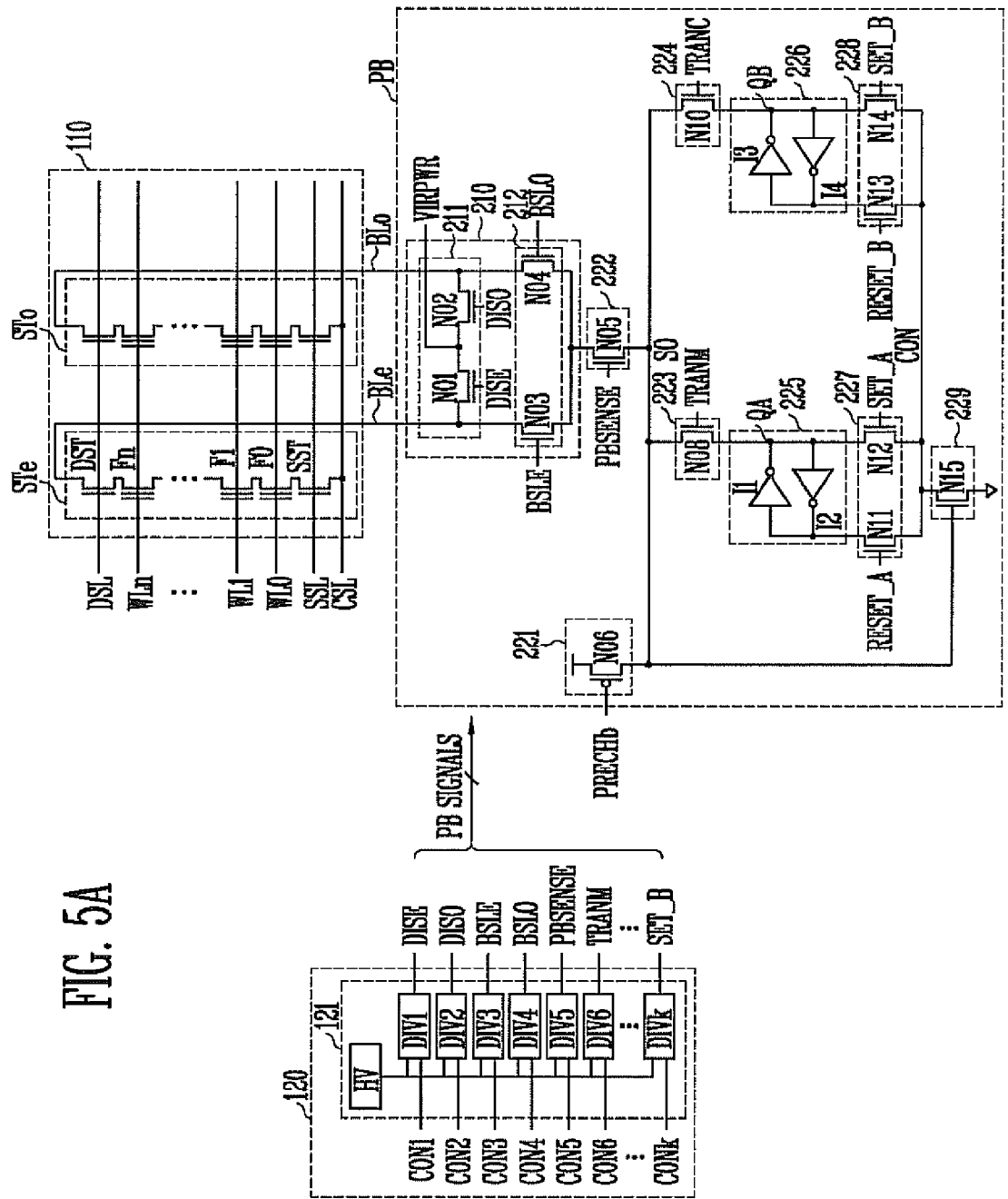
FIG. 5A is a detailed circuit diagram illustrating a page buffer and a controller according to a first embodiment of this disclosure.

FIG. 5A is a detailed circuit diagram illustrating a page buffer PB and a controller 120 according to a first embodiment of this disclosure.

Referring to FIG. 5A, the page buffer PB includes a bit line selection circuit 210 for selecting one of the bit lines BLe and BLo, a sense circuit 222 for transferring the potential of a selected bit line to a sense node SO in a read operation, a precharge circuit 221 for precharging the sense node SO, a first latch 225 and a second latch 226 for storing data, a first transfer circuit 223 for transferring data, stored in the first latch 225, to the sense node SO, a second transfer circuit 224 for transferring data, stored in the second latch 226, to the sense node SO, a first set/reset circuit 227 for setting up or resetting the first latch 225, a second set/reset circuit 228 for setting up or resetting the second latch 226, and a discharge circuit 229 for discharging a common node CON.

The bit line selection circuit 210 includes a bit line precharge circuit 211 for precharging the even bit line BLe or the odd bit line BLo in a program operation and a selection circuit 212 for selecting the even bit line BLe or the odd bit line BLo.

The bit line precharge circuit 211 includes a first switch N01 for precharging the even bit line BLe in response to an even precharge signal DISE and a second switch N02 for precharging the odd bit line BLO in response to an odd precharge signal DISO. The first switch N01 is formed of an NMOS transistor coupled between the even bit line BLe and a terminal for supplying virtual voltage VIRPWR. The second switch N02 is formed of an NMOS transistor coupled between the odd bit line BLe and the terminal for supplying the virtual voltage VIRPWR.

The selection circuit 212 includes a third switch N03 for selecting the even bit line BLe in response to an even selection signal BSLE and a fourth switch N04 for selecting the odd bit line BLo in response to an odd selection signal BSLO. Each of the third switch N03 and the fourth switch N04 is formed of an NMOS transistor.

The sense circuit 222 includes a fifth switch N05 for coupling a selected bit line and the sense node SO in response to a sense signal PBSENSE. The fifth switch N05 is formed of an NMOS transistor.

The precharge circuit 221 includes a sixth switch N06 for coupling a terminal for a power supply voltage VDD and the sense node SO in response to a precharge signal PRECHb and precharging the sense node SO. The sixth switch N06 is formed of a PMOS transistor.

The first latch 225 includes first and second inverters I1 and I2. The output terminal of the first inverter I1 and the input terminal of the second inverter I2 are coupled to a node QA, and the output terminal of the second inverter I2 and the input terminal of the first inverter I1 are coupled to each other.

The second latch 226 includes third and fourth inverters I3 and I4. The output terminal of the third inverter I3 and the input terminal of the fourth inverter I4 are coupled to a node QB, and the output terminal of the fourth inverter I4 and the input terminal of the third inverter I3 are coupled to each other. Although only the two latches 25 and 26 are illustrated as being included in the page buffer PB of FIG. 5A, one latch or three or more latches may be included in the page buffer PB according to a semiconductor device.

The first transfer circuit 223 includes an eighth switch N08 for coupling the output terminal of the first inverter I1 and the sense node SO in response to a first transfer signal TRANM. The eighth switch N08 is formed of an NMOS transistor.

The second transfer circuit 224 includes a tenth switch N10 for coupling the output terminal of the third inverter I3 and the sense node SO in response to a second transfer signal TRANC. The tenth switch N10 is formed of an NMOS transistor.

The first set/reset circuit 227 includes an 11$^{th}$ switch N11 for resetting the first latch 225 by coupling the output terminal of the second inverter I2 and the common node CON in response to a first reset signal RESET_A and a 12$^{th}$ switch N12 for setting up the first latch 225 by coupling the input terminal of the second inverter I2 and the common node CON in response to a first set signal SET_A. Each of the 11$^{th}$ and the 12$^{th}$ switches N11 and N12 is formed of an NMOS transistor.

The second set/reset circuit 228 includes a 13$^{th}$ switch N13 for resetting the first latch 226 by coupling the output terminal of the fourth inverter I4 and the common node CON in response to a second reset signal RESET_B and a 14$^{th}$ switch N14 for setting up the first latch 226 by coupling the input terminal of the fourth inverter I4 and the common node CON in response to a second set signal SET_B. Each of the 13$^{th}$ and the 14$^{th}$ switches N13 and N14 is formed of an NMOS transistor.

The discharge circuit 229 includes a 15$^{th}$ switch N15 for discharging the common node CON by coupling the common node CON and a ground terminal Vss in response to voltage of a sense node SO. The 15$^{th}$ switch N15 is formed of an NMOS transistor.

The controller 120 includes a plurality of circuits for controlling circuits included in the semiconductor device. From among the plurality of circuits, the page buffer control circuit 121 according to a first embodiment of this disclosure is described below.

The page buffer control circuit 121 includes a single high voltage generator HV and voltage dividers DIV1 to DIVk. A high voltage generated from the high voltage generator HV is transferred to the first to k$^{th}$ voltage dividers DIV1 to DIVk. The first to k$^{th}$ voltage dividers DIV1 to DIVk outputs the received high voltage in the form of signals for operating the respective switches N01 to N06, N08, and N10 to N15 of the page buffer PB in response to first to k$^{th}$ control signals CON1 to CONk generated from the controller 120. For example, the first voltage divider DIV1 may output the high voltage of the high voltage generator HV in the form of the even precharge signal DISE for turning on the first switch N01 of the page buffer PB in response to the first control signal CON1. Furthermore, the second voltage divider DIV2 may output the high voltage of the high voltage generator HV in the form of the odd precharge signal DISO for turning on the second switch N02 of the page buffer PB in response to the second control signal CON2. Likewise, in the page buffer control circuit 121, the high voltage generated from the high voltage generator HV is transferred to the first to k$^{th}$ voltage dividers DIV1 to DIVk and subsequently transferred to the switches N01 to N06, N08, and N10 to N15 included in the page buffer PB. Accordingly, the page buffer control circuit 121 includes the voltage dividers DIV1 to DIVk equal to the number of switches included in the page buffer PB. The signals outputted from the respective voltage dividers DIV1 to DIVk are collectively called the page buffer control signals PB SIGNALS.

If, as in the first embodiment, the switches of the page buffer PB are controlled by the high voltage generated from the high voltage generator HV, the driving force of the high voltage generator HV may be changed depending on data stored in the latch 225 or 226 of the page buffer PB. The data stored in the latch 225 or 226 is changed from '0' to '1' according to memory cells on which program has been completed during a program operation, and a reason thereof is described below by taking the first latch 225 as an example.

If program data is stored in the first latch 225 and thus the potential of the node QA becomes a ground voltage (0 V) level, the data stored in the first latch 225 is '0'. If program data is stored in the first latch 225 and thus the potential of the node QA becomes a power supply voltage (Vcc) level, the data stored in the first latch 225 is '1'. When the page buffer control signals PB SIGNALS of the high voltage for operating the page buffer PB are outputted, capacitance increases due to a low potential 0 V at the node QA as the number of page buffers PB in which data '0' is stored in the first latches 225 is increased. If the capacitance increases, the speed that the potential of the page buffer signals PB SIGNALS rises is changed according to the amount of capacitance. Accordingly, the turn-on speed of the switches for transferring the power supply voltage Vcc or a precharge voltage to the bit lines is changed. That is, the speed that the potentials of the bit lines are raised can be reduced according to an increase in the number of data '0', from among all data stored in the page buffers PB. According to an example, in a program operation performed on a group of memory cells coupled to a selected page (that is, the same word line), the number of page buffers PB in which data '1' is stored increases according to an increase in the number of memory cells on which program has been completed among a group of the memory cells coupled to the selected page.

Figure 5B:
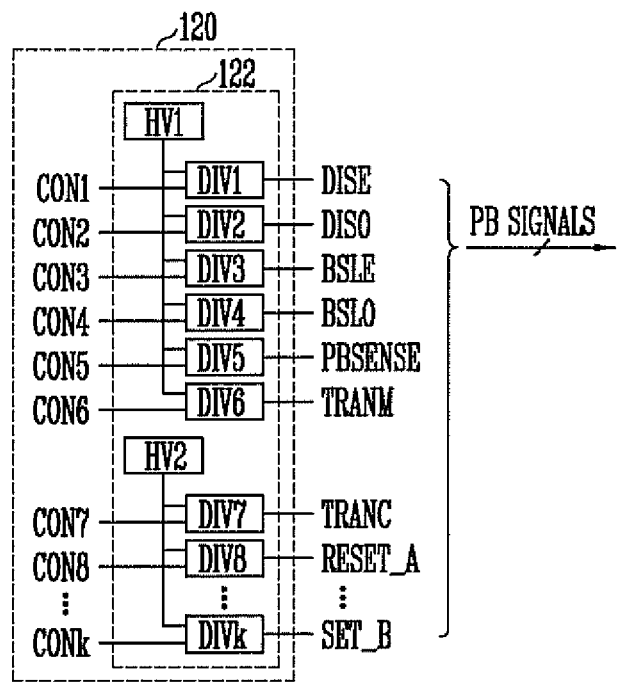
FIG. 5B is a detailed circuit diagram of a controller according to a second embodiment of this disclosure.

FIG. 5B is a detailed circuit diagram of a controller 120 according to a second embodiment of this disclosure.

Referring to FIG. 5B, the controller 120 includes a plurality of circuits for controlling circuits included in a semiconductor device. From among the plurality of circuits, a page buffer control circuit 122 according to the second embodiment of this disclosure is described below.

The page buffer control circuit 122 includes a first high voltage generator HV1, a second high voltage generator HV2, first to sixth voltage dividers DIV1 to DIV6 for receiving a high voltage generated from the first high voltage generator HV1 and outputting the high voltage in the form of the even precharge signal DISE, the odd precharge signal DISO, the even selection signal BSLE, the odd selection signal BSLO, the sense signal PBSENSE, and the first transfer signal TRANM in response to first to sixth control signals CON1 to CONE, respectively, and seventh to k$^{th}$ voltage dividers DIV1 to DIVk for receiving a high voltage generated from the second high voltage generator HV2 and outputting the high voltage in the form of the signals TRANC, RESET_A, . . . , SET_B for controlling the remaining switches of the page buffer in response to seventh to k$^{th}$ control signals CON7 to CONk, respectively.

According to an example, in FIG. 5B, the voltage dividers DIV1 to DIV6 for controlling switches for controlling the potential of the bit lines, from among the switches of the page buffer PB of FIG. 5A, are grouped, and a high voltage generated from a high voltage generator is supplied to the switch circuits DIV1 to DIV6 in common. More particularly, the high voltage of the first high voltage generator HV1 is supplied to the first to sixth voltage dividers DIV1 to DIV6 for controlling the switches N01, N03 to N05, and N08 used to incorporate data, stored in the first latch 225 of FIG. 5A, into a selected bit line BLe and for controlling the switch N2 used to precharge an unselected bit line BLo. Furthermore, the high voltage of the second high voltage generator HV2 is supplied to the remaining seventh to k$^{th}$ voltage dividers DIV7 to DIVk in common. Each of the first and the second high voltage generators HV1 and HV2 may generate the high voltage in response to an enable signal generated from the controller 120. The first to k$^{th}$ voltage dividers DIV1 to DIVk output the high voltage of the high voltage generator HV1 or HV2 in the form of the page buffer control signals PB SIGNALS in response to the first to k$^{th}$ control signals CON1 to CONk generated from the controller 120.

Figure 5C:
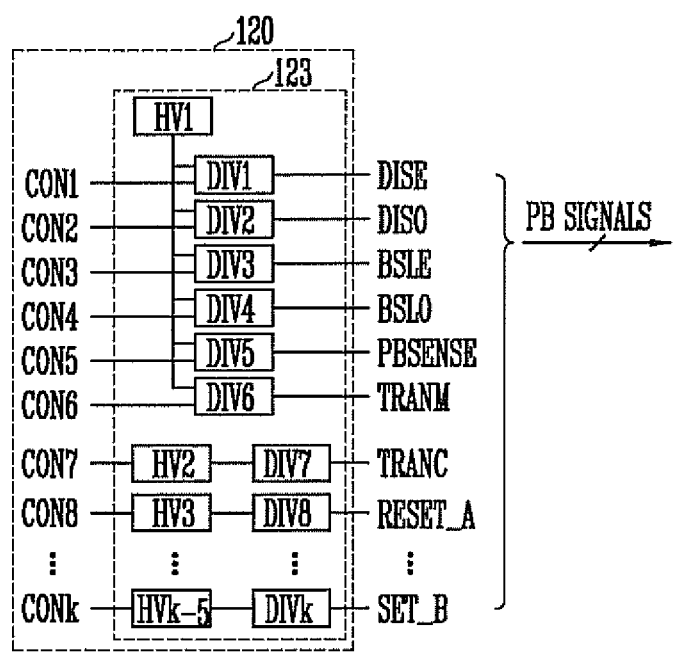
FIG. 5C is a detailed circuit diagram of a controller according to a third embodiment of this disclosure.

FIG. 5C is a detailed circuit diagram of a controller 120 according to a third embodiment of this disclosure.

Referring to FIG. 5C, the controller 120 includes a plurality of circuits for controlling circuits included in a semiconductor device. From among the plurality of circuits, a page buffer control circuit 123 according to the second embodiment of this disclosure is described below.

The page buffer control circuit 123 includes a first high voltage generator HV1 for generating a high voltage and first to sixth voltage dividers DIV1 to DIVE for receiving the high voltage from the first high voltage generator HV1 in common and outputting the high voltage in the form of the even precharge signal DISE, the odd precharge signal DISO, the even selection signal BSLE, the odd selection signal BSLO, the sense signal PBSENSE, and the first transfer signal TRANM, respectively. The page buffer control circuit 123 further includes second to (k−5)$^{th}$ high voltage generators HV2 to HVk-5 for generating respective high voltages in response to seventh to k$^{th}$ control signals CON7 to CONk and seventh to k$^{th}$ voltage dividers DIV7 to DIVk for generating the remaining signals TRANC, RESET_A, . . . , SET_B other than the even precharge signal DISE, the odd precharge signal DISO, the even selection signal BSLE, the odd selection signal BSLO, the sense signal PBSENSE, and the first transfer signal TRANM by dividing the high voltages of the second to (k−5)$^{th}$ high voltage generators HV2 to HVk-5.

According to an example, in FIG. 5C, the voltage dividers DIV1 to DIV6 for controlling switches for controlling the potential of the bit lines, from among the switches of the page buffer PB of FIG. 5A, are grouped, and a high voltage generated from a high voltage generator is supplied to the switch circuits DIV1 to DIV6 in common. More particularly, the high voltage of the first high voltage generator HV1 is supplied to the first to sixth voltage dividers DIV1 to DIV6 for controlling the switches N01, N03 to N05, and N08 used to incorporate data, stored in the first latch 225 of FIG. 5A, into a selected bit line BLe and for controlling the switch N2 used to precharge an unselected bit line BLo. The first to sixth voltage dividers DIV1 to DIV6 outputs the received high voltage in the form of the page buffer control signals DISE, DISO, BSLE, BSLO, PBSENSE, and TRANM, belonging to a first group, in response to the first to sixth control signals CON1 to CONE, respectively. Furthermore, the remaining second to (k−5)$^{th}$ high voltage generators HV2 to HVk-5 generate the page buffer control signals, belonging to a second group, in response to the seventh to k$^{th}$ control signals CON7 to CONk, respectively. That is, the page buffer control signals PB SIGNALS include the page buffer control signals of the first group, generated from the first to sixth voltage dividers DIV1 to DIVE, and the page buffer control signals of the second group, generated from the second to (k−5)$^{th}$ high voltage generators HV2 to HVk-5.

Figure 6A:
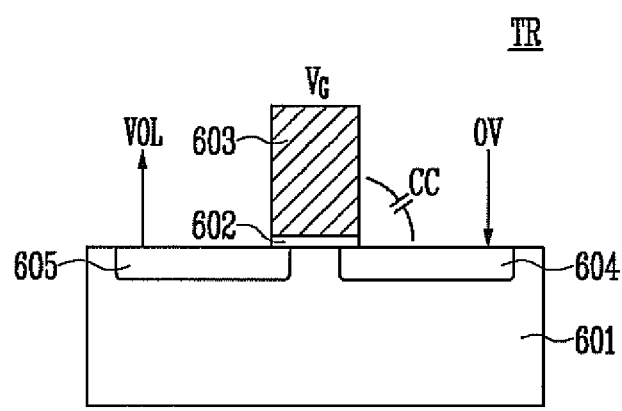
FIG. 6A is a sectional view of a transistor for illustrating the principle of the present disclosure.

FIG. 6A is the sectional view of a transistor for illustrating the principle of the present disclosure.

The principle that capacitance is changed depending on data stored in the latch of a page buffer is described in more detail below with reference to FIG. 6A.

Each of the switches N01 to N06, N08, and N10 to N15 included in the page buffer PB of FIG. 5A is formed of a transistor TR as shown in FIG. 6A. FIG. 6A shows a basic structure of the transistor. The transistor includes a gate electrode 603 formed over a semiconductor substrate 601, a drain 604 and a source 605 formed in the semiconductor substrate 601 and formed to adjoin both ends of the gate electrode 603, and a gate insulating layer 602 formed between the gate electrode 603 and the semiconductor substrate 601. If the potential of the drain 604, from the junctions of the transistor TR, is 0 V, when a turn-on voltage $V_G$ is supplied to the gate electrode 603, the time for raising the potential of the gate electrode 603 up to the target level of the turn-on voltage $V_G$ is increased because of capacitance cc between the gate electrode 603 and the drain 604. This characteristic is greater when a plurality of transistors is coupled than when a single transistor is used.

The characteristic is described below with reference to FIG. 6B below.

Figure 6B:
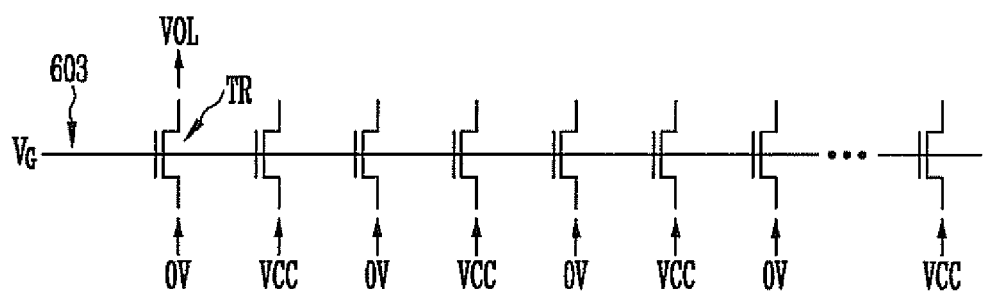
FIG. 6B is a diagram illustrating an example in which a plurality of the transistors described with reference to FIG. 6A is coupled.

FIG. 6B is a diagram illustrating an example in which a plurality of the transistors described with reference to FIG. 6A is coupled.

Referring to FIG. 6B, if the gate electrodes 603 of the plurality of transistors TR are coupled to the same gate line, the gate voltage supplied to the gate line is influenced by electric potential applied to the drain of each of the transistors. That is, capacitance is more increased when transistors in which the potentials of drains have 0 V or a power supply voltage Vcc are alternately arranged than when transistors in which the potentials of drains have the power supply voltage Vcc, with the result that the time taken to raise the potential of the gate line is increased. Accordingly, the transistor TR having the drain supplied with the power supply voltage Vcc, from among the transistors, is slowly turned on, and thus voltage VOL supplied to the source of the transistor TR also slowly rises.

Figure 7:
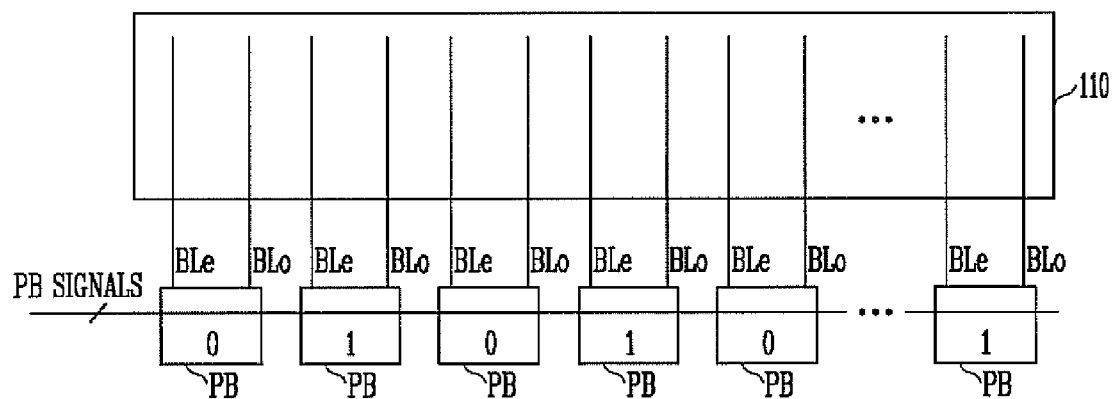
FIG. 7 is a diagram illustrating an example in which the principle described with reference to FIGS. 6A and 6B is applied to the semiconductor device of the present disclosure.

FIG. 7 is a diagram illustrating an example in which the principle described with reference to FIGS. 6A and 6B is applied to the semiconductor device of the present disclosure.

Referring to FIG. 7, like in FIG. 6B, capacitance increases according to an increase in the number of data '0' stored in a plurality of the page buffers PB included in the semiconductor device, and thus the time taken to raise the page buffer control signal PB SIGNALS up to a target level is increased. For this reason, since switches for coupling the page buffer PB and the bit line BLe or BLo are slowly turned on, the time that the potential of the bit line BLe to which the power supply voltage Vcc will be transferred reaches the target level (that is, the power supply voltage (Vcc) level is also increased.

Accordingly, capacitance is great because the number of program data '0' is greater at the early stage of a program operation than at the latter part of the program operation, and thus the time taken to raise the potentials of unselected bit lines up to a target level is also increased.

Figure 8:
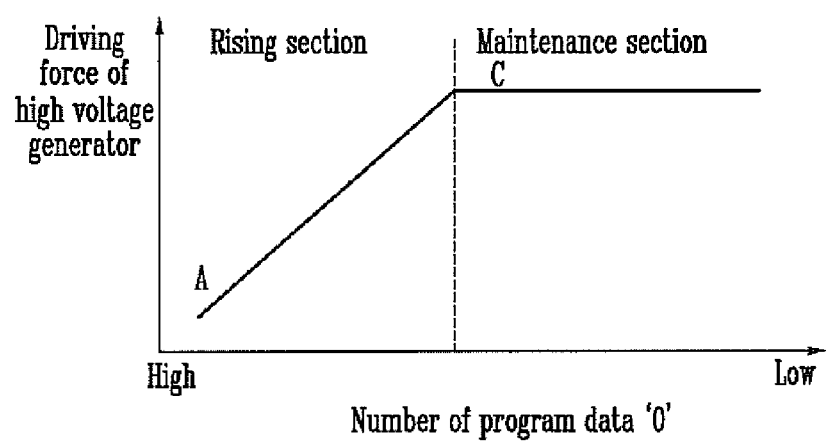
FIG. 8 is a graph illustrating the driving force of a high voltage generator according to program data.

FIG. 8 is a graph illustrating the driving force of the high voltage generator according to program data.

More particularly, FIG. 8 is a graph showing a change in the driving force of the high voltage generator according to a change in the number of program data '0' during a program operation. At the early stage (A) of the program operation, the number of program data '0' is the greatest because a memory cell on which program has been completed does not exist. In this case, the driving force of the high voltage generator, that is, the high voltage source of the page buffer control signals PB SIGNALS transferred to a relevant page buffer is the smallest because capacitance in the page buffer is the greatest. Since memory cells on which program has been completed are capacitively coupled to memory cells to be programmed, as the program operation is performed, some of the program data '0' stored in the page buffers is changed to '1', and thus the number of program data '0' is gradually reduced. Accordingly, the driving force of the high voltage generator gradually rises because the capacitance of the page buffer is reduced (that is, a rising section). The driving force of the high voltage generator becomes substantially constant irrespective of a reduction in the capacitance after the number of program data '0' reaches a specific number (that is, a maintenance section). Here, the specific number may correspond to about 50% of the total number of page buffers included in the semiconductor device. According to an example, at the early stage of the rising section, although the potential of a bit line to which a program inhibition voltage (for example, a power supply voltage Vcc) is supplied does not reach a target level, unselected memory cells avoid being programmed because a program voltage supplied to a selected word line is low at the early stage of a program operation.

Figure 9:
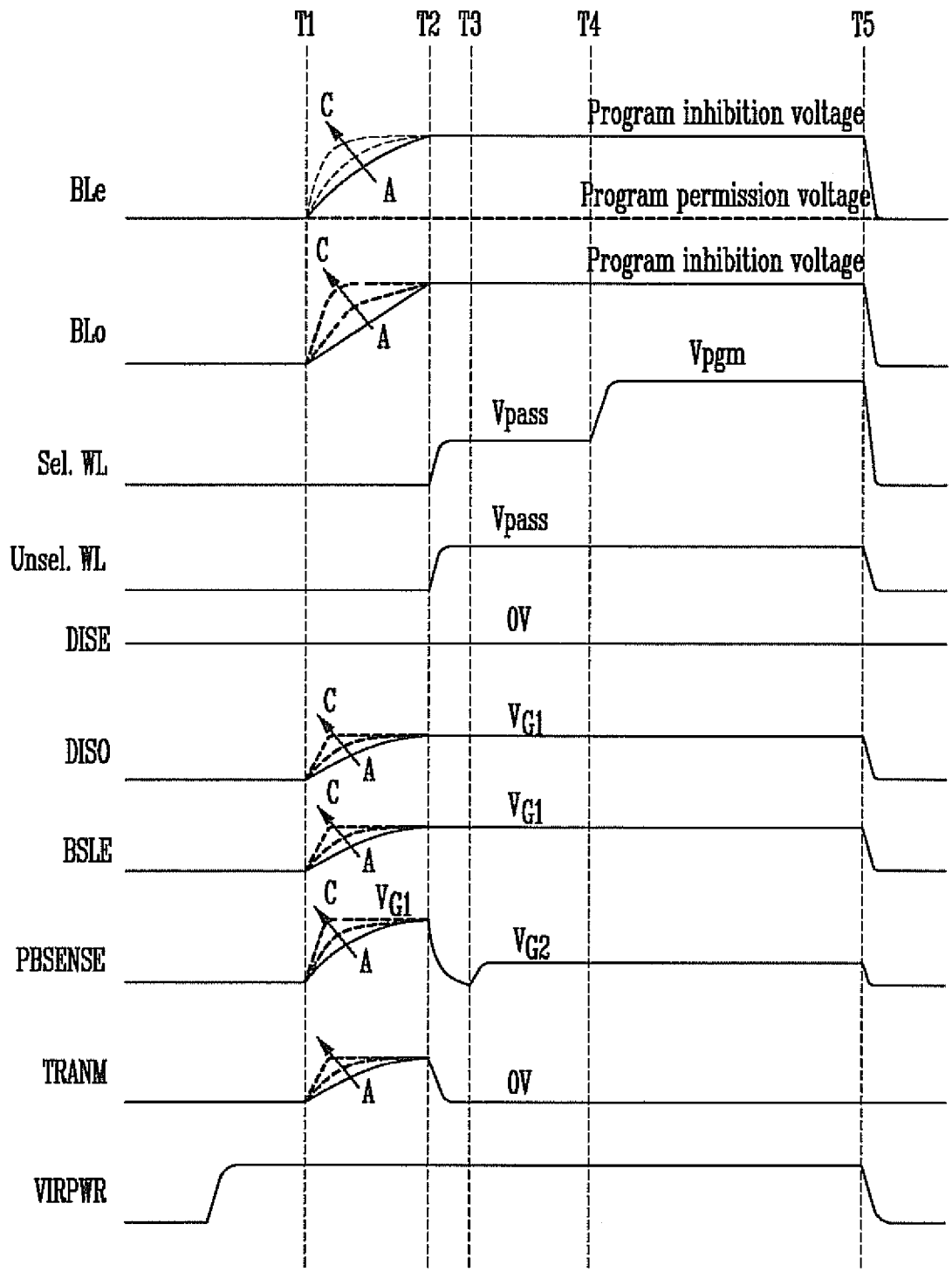
FIG. 9 a timing diagram illustrating a program method according to the present disclosure.

FIG. 9 a timing diagram illustrating a program method according to the present disclosure.

A program operation when the even bit lines BLe are selected and the odd bit lines BLo are not selected is described below as an example with reference to FIGS. 9 and 5A.

Bit Line Precharge Section (T1 to T2)

After raising the virtual voltage VIRPWR to a high level, the odd precharge signal DISO, the even selection signal BSLE, the sense signal PBSENSE, and the first transfer signal TRANM are supplied to the respective switches N02, N03, N05, and N08 of FIG. 5A at a point of time T1. The high voltage sources, that is, the odd precharge signal DISO, the even selection signal BSLE, the sense signal PBSENSE, and the first transfer signal TRANM are generated by the high voltage generator 121 of FIG. 5A. Thus, the time taken for each of the odd precharge signal DISO, the even selection signal BSLE, the sense signal PBSENSE, and the first transfer signal TRANM to reach a target level $V_{G1}$ is different depending on program data stored in the first latch 225 of FIG. 5A. For example, in a program operation performed in accordance with an incremental step pulse program (ISPP) method, at the early stage (A) of the program operation, the time that the odd precharge signal DISO, the even selection signal BSLE, the sense signal PBSENSE, and the first transfer signal TRANM reach the target level $V_{G1}$ is long because the number of memory cells having program data '0' is great. However, as the program operation progresses, that is, the number of memory cells on which program has been completed is increased (C), the number of page buffers PB in which program data '1' is stored in the first latches 255 is increased. Accordingly, capacitance in the page buffer PB is reduced, and the time that the odd precharge signal DISO, the even selection signal BSLE, the sense signal PBSENSE, and the first transfer signal TRANM reach the target level $V_{G1}$ is reduced (C).

If program data '0' has been inputted to the first latch 255, when the odd precharge signal DISO is supplied to the second switch N02, the terminal for supplying the virtual voltage VIRPWR and the unselected odd bit lines BLo are coupled, and thus the program inhibition voltage Vcc is supplied to the unselected odd bit lines BLo. At the same time, when the even selection signal BSLE, the sense signal PBSENSE, and the first transfer signal TRANM are supplied to the respective switches N03, N05, and N08, the selected even bit lines BLe maintain the program permission voltage of 0 V. In this case, as the number of page buffers PB in which program data '0' is stored in their latches 225, from among the page buffers PB of the semiconductor device, increases, the program inhibition voltage Vcc supplied to the unselected odd bit lines BLo slowly rises up to the target level $V_{G1}$ (A). As the number of page buffers PB in which program data '0' is stored in their latches 225, from among the page buffers PB of the semiconductor device, decreases, the program inhibition voltage Vcc supplied to the unselected odd bit lines BLo rapidly rises up to the target level $V_{G1}$ (C).

If program data '1' has been inputted to the first latch 255, when the odd precharge signal DISO is supplied to the second switch N02, the terminal for supplying the virtual voltage VIRPWR and the unselected odd bit lines BLo are coupled, and thus the potentials of the unselected odd bit lines BLo gradually rise. At the same time, when the even selection signal BSLE, the sense signal PBSENSE, and the first transfer signal TRANM are supplied to the respective switches N03, N05, and N08, voltages of the selected even bit lines BLe rise to the program inhibition voltage Vcc. In this case, as the number of page buffers PB in which program data '0' is stored in their latches 225, from among the page buffers PB of the semiconductor device, increases, the program inhibition voltage Vcc supplied to the unselected odd bit lines BLo and the selected even bit lines BLe slowly rises (A). As the number of page buffers PB in which program data '0' is stored in their latches 225, from among the page buffers PB of the semiconductor device, decreases, the program inhibition voltage Vcc supplied to the unselected odd bit lines BLo and the selected even bit lines BLe rapidly rises (C).

Accordingly, a sudden increase in the peak current can be suppressed by slowing the speed that the potentials of the even and odd bit lines BLe and BLo rise, at the early stage of the program operation.

Pass Voltage Supply Section (T2 to T3)

The fifth and the sixth switches DIV5 and DIVE of FIG. 5A are turned off so that the supply of the sense signal PBSENSE and the first transfer signal TRANM is blocked, and a pass voltage Vpass is supplied to all the word lines Sel. WL and Unsel. WL.

Boosting Section (T3 to T4)

The state in which the pass voltage Vpass is supplied to all the word lines Sel. WL and Unsel. WL remains intact for a specific time so that channel boosting is generated in unselected cell strings. Accordingly, the potential of the channel of the unselected cell strings rises. In this case, the sense signal PBSENSE may maintain a low level, but the sense signal PBSENSE having a high level $V_{G2}$ lower than the target level $V_{G1}$ may be generated so that data stored in the first latches 225 continues to be incorporated into the selected bit lines during the program operation.

Program Voltage Supply Section (T4 to T5)

Selected memory cells included in the selected cell strings are programmed by supplying a program voltage Vpgm to the selected word line Sel. WL.

After the point of time T5, a program verify operation is performed on the selected memory cells coupled to the selected word line Sel. WL. If a result of the program verify operation is a pass, the program operation is finished. If a result of the program verify operation is not a pass, however, the program operation and the program verify operations are repeatedly performed until the threshold voltages of all the selected memory cells reach the program target level while gradually raising the program voltage Vpgm.

In accordance with the present disclosure, the size of a semiconductor device and current consumed in a program operation can be reduced by reducing the number of high voltage generators for controlling a page buffer.

What is claimed is:

1. A semiconductor device, comprising:
   cell strings, each of which includes a plurality of memory cells;
   a page buffer having latches coupled to bit lines and circuits for precharging the bit lines in response to page buffer control signals;
   a single high voltage generator configured to generate a high voltage;
   a plurality of voltage dividers configured to receive the high voltage in common, and output the page buffer control signals to the page buffer in response to control signals, respectively; and
   a controller configured to generate the control signals for controlling the page buffer control circuit.

2. The semiconductor device of claim 1, wherein the single high voltage generator and the voltage dividers are disposed closer to the page buffer than the controller.

3. A semiconductor device, comprising:
   even and odd cell strings, each of which includes a plurality of memory cells;
   a page buffer including a bit line precharge circuit for precharging an even bit line coupled to the even cell string and an odd bit line coupled to the odd cell string in response to an even precharge signal and an odd precharge signal, respectively; a selection circuit for selecting one of the even bit line and the odd bit line in response to an even selection signal and an odd selection signal, respectively; a sense circuit for coupling a selected bit line and a sense node in response to a sense signal; and a transfer circuit for transferring data stored in a latch to the sense node in response to a transfer signal;
   a single high voltage generator configured to generate a high voltage; and
   a plurality of voltage dividers configured to receive the high voltage in common, and generate the even and odd precharge signals, the even and odd selection signals, the sense signal, and the transfer signal by dividing the high voltage in response to control signals, respectively.

4. A semiconductor device, comprising:
   page buffers configured to store data; and
   a page buffer control circuit configured to generate page buffer control signals for operating the page buffers, wherein the page buffer control circuit comprises:
   a single high voltage generator, as a high voltage source, configured to generate a high voltage; and
   voltage dividers configured to commonly receive the high voltage in common and to generate the page buffer control signals in response to control signals,
   wherein a driving force of the single high voltage generator varies depending on data stored in the page buffers.

5. The semiconductor device of claim 4, wherein the driving force of the single high voltage generator is changed depending on a total number of the page buffers having data '0' stored therein.

6. The semiconductor device of claim 4, wherein:
   the driving force of the single high voltage generator gradually rises until a total number of the page buffers having data '0' stored therein decreases and reaches a specific number, and is kept at a substantially constant level after the total number of the page buffers having data '0' stored therein reaches the specific number.

7. The semiconductor device of claim 4, wherein in a program operation, a program inhibition voltage is supplied to bit lines coupled to the page buffers having data '0' stored therein and a program allow voltage is supplied to other bit lines.

8. The semiconductor device of claim 7, wherein a period of time taken for the program inhibition voltage in reaching a target level is varied by the driving force of the high voltage generator.

9. The semiconductor device of claim 8, wherein a period of time taken for the program inhibition voltage in reaching the target level is proportional to the driving force of the high voltage generator.

10. A method of operating a semiconductor device, comprising:
- generating a high voltage using a single high voltage generator;
- generating page buffer control signals by dividing the high voltage in response to control signals; and
- supplying a program inhibition voltage or a program permission voltage to bit lines coupled to cell strings in response to the page buffer control signals.

11. The method of claim 10, wherein in a program operation, the program inhibition voltage is a power supply voltage and the program permission voltage is a ground voltage.

12. The method of claim 10, wherein in a program operation, the page buffer control signals are simultaneously generated in order to supply the program inhibition voltage or the program permission voltage to the bit lines.

* * * * *